(12) United States Patent
Kim et al.

(10) Patent No.: US 11,778,755 B2
(45) Date of Patent: Oct. 3, 2023

(54) DISPLAY DEVICE

(71) Applicant: Samsung Display Co., Ltd., Yongin-si (KR)

(72) Inventors: Yun Jae Kim, Cheonan-si (KR); Dong Cheol Kim, Suwon-si (KR); Jae Chun Park, Seoul (KR); Mun Sik Ham, Cheonan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/891,054

(22) Filed: Jun. 3, 2020

(65) Prior Publication Data

US 2021/0029837 A1 Jan. 28, 2021

(30) Foreign Application Priority Data

Jul. 22, 2019 (KR) .......................... 10-2019-0088331

(51) Int. Cl.
*H05K 5/00* (2006.01)
*H05K 5/02* (2006.01)

(52) U.S. Cl.
CPC ......... *H05K 5/0017* (2013.01); *H05K 5/0217* (2013.01)

(58) Field of Classification Search
CPC ............... H05K 5/0017; H05K 5/0217; G02F 1/133308; G02F 2201/54; G02F 1/133305; H01L 51/5237; H01L 51/5246; H01L 33/54; H01L 51/5293; H01L 2251/5338; G09F 9/301; G06F 1/1641
See application file for complete search history.

(56) References Cited

U.S. PATENT DOCUMENTS

| | | | |
|---|---|---|---|
| 9,173,287 B1 | 10/2015 | Kim et al. | |
| 9,348,450 B1 | 5/2016 | Kim | |
| 9,697,941 B2 * | 7/2017 | Lee | G02F 1/13 |
| 10,188,004 B2 * | 1/2019 | Yeh | H05K 5/0226 |
| 10,268,242 B2 * | 4/2019 | Seo | G02F 1/133308 |
| 10,495,941 B2 * | 12/2019 | Hashimoto | G02F 1/133305 |
| 10,930,883 B2 * | 2/2021 | Park | G06F 1/1652 |

(Continued)

FOREIGN PATENT DOCUMENTS

KR 10-2016-0035146 3/2016

OTHER PUBLICATIONS

Extended European Search Report dated Nov. 10, 2020, issued to European Patent Application 20186954.

*Primary Examiner* — Anthony M Haughton
*Assistant Examiner* — Theron S Milliser
(74) *Attorney, Agent, or Firm* — H.C. Park & Associates, PLC

(57) ABSTRACT

A display device including a display panel has a folding portion, a metal layer disposed on one surface of the display panel, and including a first metal layer and a second metal layer spaced apart from each other in the folding portion, a first adhesive layer disposed at edges of the first metal layer and the second metal layer, and a first compressible member disposed on the first metal layer and a second compressible member disposed on the second metal layer, the first and second compressible members being disposed closer to the folding portion than the first adhesive layer, in which the first and second compressible members each have a thickness greater than a thickness of the first adhesive layer.

13 Claims, 20 Drawing Sheets

(56) References Cited

U.S. PATENT DOCUMENTS

| | | | |
|---|---|---|---|
| 2004/0264851 A1* | 12/2004 | Amiri | H01H 13/702 385/31 |
| 2015/0070601 A1* | 3/2015 | Lin | G02F 1/13338 349/12 |
| 2016/0209874 A1 | 7/2016 | Choi et al. | |
| 2016/0218153 A1 | 7/2016 | Kim | |
| 2016/0278222 A1* | 9/2016 | Lee | G02F 1/133305 |
| 2016/0338219 A1* | 11/2016 | Seo | G06F 1/1652 |
| 2016/0378203 A1 | 12/2016 | Kim et al. | |
| 2017/0374749 A1* | 12/2017 | Lee | E05D 11/0054 |
| 2018/0102496 A1 | 4/2018 | Kim et al. | |
| 2018/0151644 A1* | 5/2018 | Han | G09G 3/3225 |
| 2018/0160553 A1* | 6/2018 | Yeh | G09F 9/301 |
| 2018/0335679 A1* | 11/2018 | Hashimoto | G06F 1/1641 |
| 2019/0074469 A1 | 3/2019 | Kwon et al. | |
| 2019/0081254 A1* | 3/2019 | Wang | H01L 51/5246 |
| 2019/0334114 A1* | 10/2019 | Park | H01L 51/0097 |
| 2020/0204666 A1* | 6/2020 | Hong | G06F 1/1652 |
| 2021/0143363 A1* | 5/2021 | Park | H01L 51/5246 |

\* cited by examiner

DISPLAY DEVICE

CROSS-REFERENCE TO RELATED APPLICATION

This application claims priority from and the benefit of Korean Patent Application No. 10-2019-0088331 filed on Jul. 22, 2019, which is hereby incorporated by reference for all purposes as if fully set forth herein.

BACKGROUND

Field

Exemplary embodiments of the invention relate generally to a display device and, more specifically, to a foldable display device that suppresses generation of wrinkles in a folding portion.

Discussion of the Background

Recently, a flexible display device that can be bent has been developed. Such a flexible display device may be used in a folded or in a curved form, and thus, may be used in various technical applications. In a flexible display device, a display element is generally disposed on a flexible substrate.

Display elements that can be applied to a flexible display device may include a light emitting diode (LED), a liquid crystal display (LCD) element, and an electrophoretic display (EPD) element. Among the display elements, light emitting diodes generally have a thin-film stacked structure with excellent flexibility, and thus, LEDs have been spotlighted as display devices of flexible display devices.

A flexible display device may be classified as a rollable display device that is rollable like a roll, a foldable display device that is foldable like a paper, a stretchable display device that can be scaled up and down in size, and the like, depending on the extent of bending. In particular, some structures disposed in a folding portion of the foldable display device may be removed, such that the display device can be folded easily. Repeated folding of the folding portion of the display device can produce defects, such as wrinkles.

The above information disclosed in this Background section is only for understanding of the background of the inventive concepts, and, therefore, it may contain information that does not constitute prior art.

SUMMARY

Applicant discovered that defects, such as wrinkles, in a foldable display device can be caused by misalignment due to certain internal structures or layers in the display device. Display devices constructed according to exemplary embodiments of the invention are capable of reducing wrinkles in a folding portion of a display device.

Additional features of the inventive concepts will be set forth in the description which follows, and in part will be apparent from the description, or may be learned by practice of the inventive concepts.

A display device according to an exemplary embodiment includes a display panel including a folding portion, a metal layer disposed on one surface of the display panel, and including a first metal layer and a second metal layer spaced apart from each other in the folding portion, a first adhesive layer disposed at edges of the first metal layer and the second metal layer, and a first compressible member disposed on the first metal layer and a second compressible member disposed on the second metal layer, the first and second compressible members being disposed closer to the folding portion than the first adhesive layer, in which the first and second compressible members each have a thickness greater than a thickness of the first adhesive layer.

The first and second compressible members may include first and second cushion layers, respectively, in which the thicknesses of the first cushion layer and the second cushion layer are about 10% to about 50% thicker than the thickness of the first adhesive layer.

The thickness of the first adhesive layer is in a range of about 50 μm to about 85 μm.

The first and second compressible members may include first and second cushion layers, respectively, in which the thicknesses of the first cushion layer and the second cushion layer are in a range of about 90 μm to about 150 μm.

The first adhesive layer may be spaced apart from at least one of the first and second compressible members.

The display device may further include a set bracket including a first portion and a second portion spaced apart from each other, in which the first portion of the set bracket may be attached to the first metal layer through the first adhesive layer, and the second portion of the set bracket may be attached to the second metal layer through the first adhesive layer.

The first and second compressible members may be compressed by the set bracket.

The first and second compressible members compressed by set bracket may have a same thickness with the thickness of the first adhesive layer, and the first and second compressible member may support the display panel.

A display device according to another exemplary embodiment includes a display panel including a folding portion, a metal layer disposed on one surface of the display panel, the metal layer including a first metal layer and a second metal layer spaced apart from each other in the folding portion, a first adhesive layer disposed at edges of the first metal layer and the second metal layer, and a first compressible member disposed on the first metal layer and a second compressible member disposed on the second metal layer, each of the first and second compressible members including a first portion and a second portion, in which the first portion has a thickness greater than that of the second portion, and the first portion is disposed closer to the folding portion than the second portion.

The thickness of the first portion of each of the first and second compressible members may be greater than that of the first adhesive layer.

A display device according to still another exemplary embodiment includes a display panel including a folding portion, a metal layer disposed on one surface of the display panel, and including a first metal layer and a second metal layer spaced apart from each other in the folding portion, a first adhesive layer disposed at edges of the first metal layer and the second metal layer, and a first compressible member disposed on the first metal layer and a second compressible member disposed on the second metal layer, in which at least one of the first and second compressible members has a thickness that increases towards the folding portion.

The first and the second compressible members may include a first cushion layer and a second cushion layer, respectively, each of which is spaced apart from the first adhesive layer, and disposed closer to the folding portion than the first adhesive layer.

A display device according to still another exemplary embodiment includes a display panel including a folding portion, a metal layer disposed on one surface of the display panel, and including a first metal layer and a second metal layer spaced apart from each other in the folding portion, a first adhesive layer disposed at edges of the first metal layer and the second metal layer; and a first compressible member disposed on the first metal layer and a second compressible member disposed on the second metal layer, the first and second compressible members being disposed closer to the folding portion than the first adhesive layer, a set bracket including a first portion and a second portion spaced apart from each other, in which the first portion of the set bracket is attached to the first metal layer through the first adhesive layer; and the second portion of the set bracket is attached to the second metal layer through the first adhesive layer, the first and second compressible members is compressed by the set bracket, and the first and second compressible members have a same thickness with the thickness of the first adhesive layer, and the first and second compressible member support the display panel.

A portion having the greatest thickness in the first compressible member and the second compressible member may be thicker than that of the first adhesive layer.

A display device according to yet another exemplary embodiment includes a display panel including a folding portion, a metal layer disposed on one surface of the display panel, and including a first metal layer and a second metal layer spaced apart from each other in the folding portion, a first compressible member disposed on the first metal layer and a second compressible member disposed on the second metal layer, and a first adhesive layer disposed on the first compressible member and the second compressible member.

The first and second compressible members may include first and second cushion layers, respectively, in which each of the first cushion layer and the second cushion layer have a thickness in a range of about 90 µm to about 150 µm.

The display device may further include a set bracket including a first portion and a second portion spaced apart from each other, in which the first portion of the set bracket may be attached to the first compressible member through the first adhesive layer, and the second portion of the set bracket may be attached to the second compressible member through the first adhesive layer.

The display device may be foldable at the folding portion.

The first compressible member and the second compressible member may include a first portion and a second portion, the first portion may have a thickness greater than that of the second portion, and the first portion may be disposed closer to the folding portion than the second portion.

The first adhesive layer may be disposed on the first portion and the second portion.

The first compressible member may have a thickness that increases towards the folding portion, and the second compressible member may have a thickness that increases towards the folding portion.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
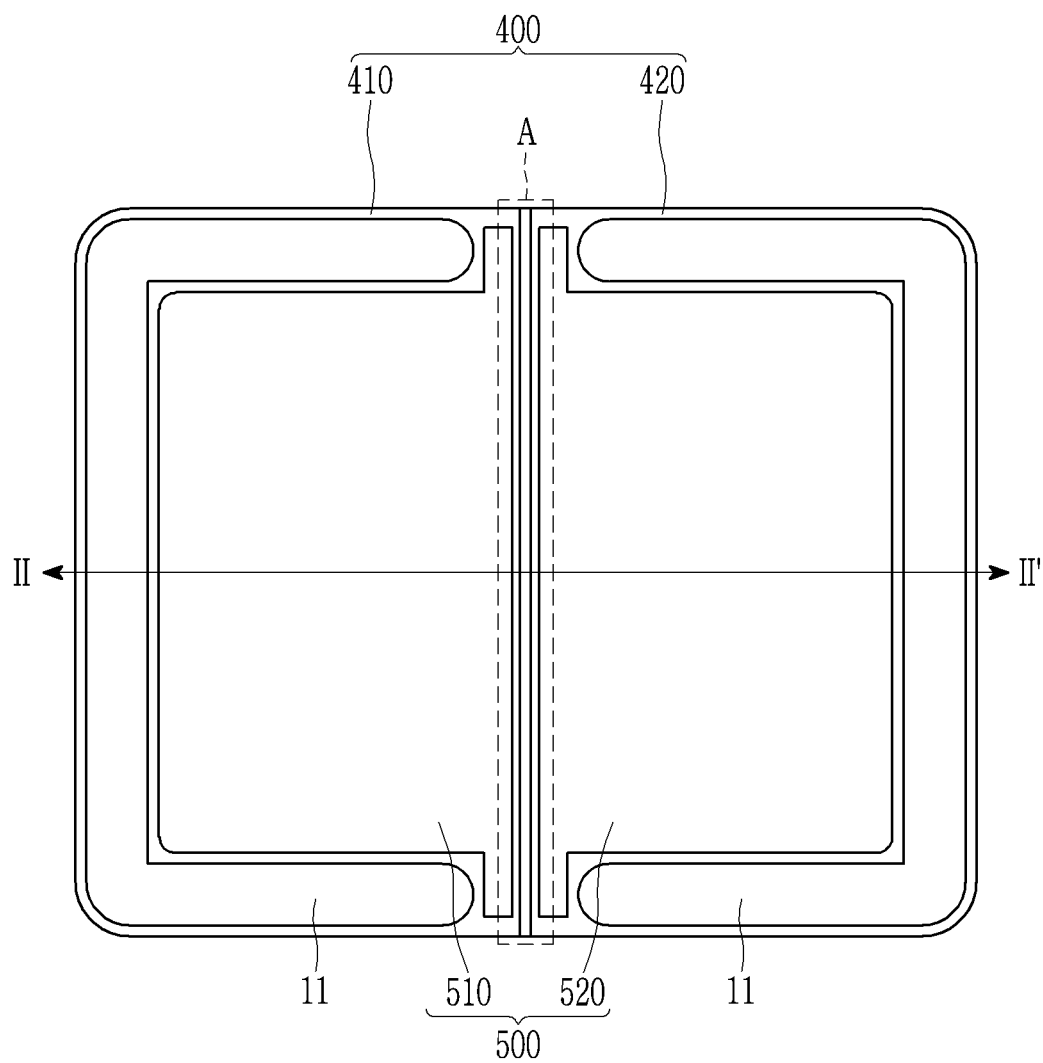
FIG. 1 is a schematic plan view of an exemplary embodiment of a display device constructed according to the principles of the invention.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Hereinafter, one or more display devices according to one or more exemplary embodiments of the invention will be described in detail with reference to the drawings.

The display device according to the exemplary embodiment illustrated in FIG. 1 may be a foldable display device. FIG. 1 illustrates a rear surface of a display device without showing a set bracket according to an exemplary embodiment.

Referring to FIG. 1, a portion indicated with A is a folding portion, by which a display device may be folded. The display device may include a first adhesive layer 11, which may attach a set bracket (such as set bracket 700 in FIG. 4) on the rear surface of the display device. The first adhesive layer 11 may be disposed along edges of a metal layer 400, which includes a first metal layer 410 and a second metal layer 420.

The first metal layer 410 and the second metal layer 420 are spaced apart from each other, such that the display device may be folded in a region where the first metal layer 410 and the second metal layer 420 are not disposed. As such, the first metal layer 410 and the second metal layer 420 may define the folding portion A, and the display device may be folded in an area on which the first and second metal layers 410 and 420 are not disposed.

The display device may further include a compressible member, such as a cushion layer 500, which may include a first cushion layer 510 and a second cushion layer 520. The first cushion layer 510 and the second cushion layer 520 may be positioned in central regions of the first metal layer 410 and the second metal layer 420, respectively, and may have a thickness greater than that of the first adhesive layer 11. In this manner, the cushion layer 500 may support the display device in the folding portion A of the display device, and minimize generation of wrinkles in the folding portion A, which will be described in more detail below.

Figure 2:
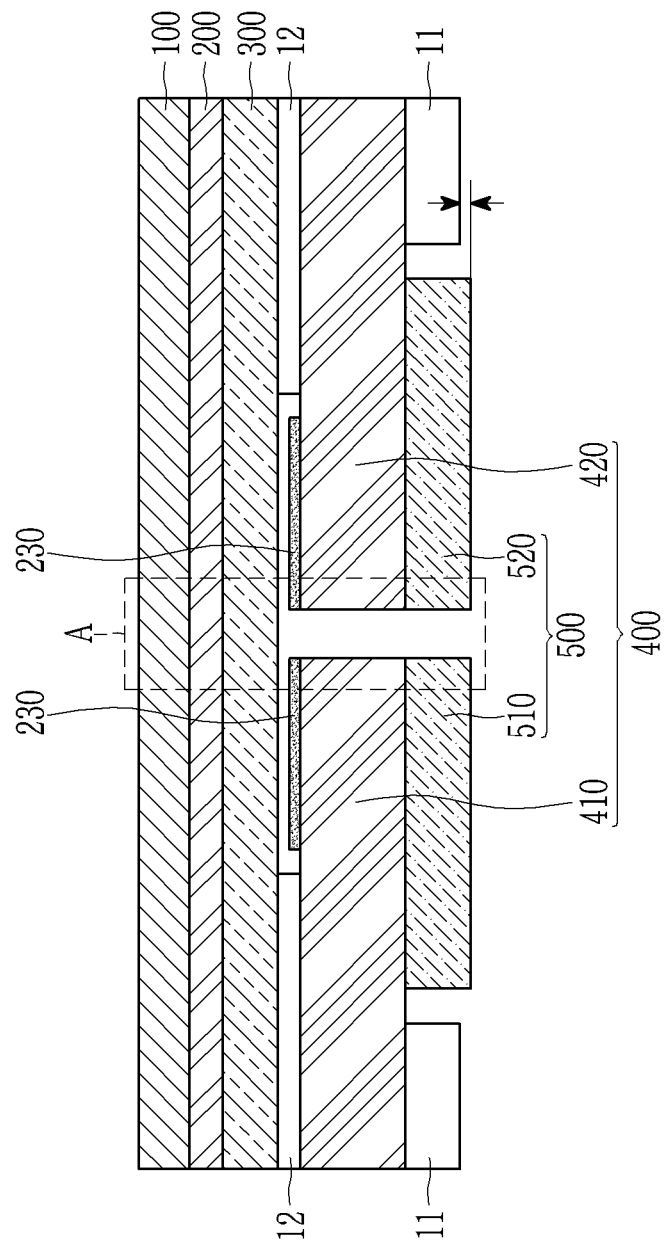
FIG. 2 is a cross-sectional view taken along line II-II' of FIG. 1 according to an exemplary embodiment.

FIG. 2 is a cross-sectional view taken along line II-II' of FIG. 1 according to an exemplary embodiment.

Referring to FIG. 2, the display device includes a display panel 200 and a window 100 disposed on one surface of the display panel 200.

The display panel 200 may include a light emitting diode. In particular, the display panel 200 may include a light emitting diode connected to a plurality of transistors. The light emitting diode may include an emission layer positioned between two electrodes. The emission layer may include an organic material, or may include an inorganic material, such as a quantum dot.

The display device may further include a passivation layer 300 disposed on one surface of the display panel 200. The passivation layer 300 may be elastic to protect the display panel 200 from external impact. The passivation layer 300 may include a polymer, such as a polyurethane foam. The passivation layer 300 may overlap a front surface of the display panel 200.

The metal layer 400 including the first metal layer 410 and the second metal layer 420 is attached to the passivation layer 300 through a second adhesive layer 12. As described above, the first metal layer 410 and the second metal layer 420 are spaced apart from each other, and a portion between the first metal layer 410 and the second metal layer 420 may be defined as the folding portion A, in which the display device may be folded. Since the metal layer 400 is not disposed in the folding portion A, the display device may be folded easily.

The second adhesive layer 12 attaches the metal layer 400 and the passivation layer 300 at edges of the first metal layer 410 and the second metal layer 420. A tape 230 is disposed in an area of the metal layer 400 where the second adhesive layer 12 is not disposed. The tape 230 may have a thickness similar to that of the second adhesive layer 12, and may substantially fill a step between the passivation layer 300 and the metal layer 400, and is thus referred to herein as a "stepped tape". More particularly, the stepped tape 230 compensates for and fills in at least part of the step formed by the second adhesive layer 12. The thickness of the stepped tape 230 may be similar to that of the second adhesive layer 12, but may be thinner than the second adhesive layer 12. In this case, a gap may be formed between the passivation layer 300 and the metal layer 400. In some exemplary embodiments, even when the thickness of the stepped tape 230 is formed to be the same as that of the second adhesive layer 12, the thickness of the stepped tape 230 may be less than that of the second adhesive layer 12 due to process variation during manufacture. The stepped tape 230 may have a black color.

The first adhesive layer 11 is disposed at a lower portion of the metal layer 400. The first adhesive layer 11 may be disposed at the edges of the first metal layer 410 and the second metal layer 420. The first adhesive layer 11, however, may not be disposed at the edges of the first metal layer 410 and the second metal layer 420 adjacent to the folding portion A, as shown in FIG. 2.

The display device may further include a cushion layer 500, which includes a first cushion layer 510 and a second cushion layer 520 disposed on the metal layer 400. The cushion layer 500 may include a polymer having elasticity, such as polyurethane. In this case, the density of the polyurethane may be about 0.7 g/fcm$^3$ or less. The cushion layer 500 may be disposed at inner edges of the first metal layer 410 and the second metal layer 420 adjacent to the folding portion A.

The first cushion layer 510 is disposed on the first metal layer 410, and the second cushion layer 520 is disposed on the second metal layer 420. The first cushion layer 510 and the second cushion layer 520 may be spaced apart from the first adhesive layer 11.

According to the illustrated exemplary embodiment, the thicknesses of the first cushion layer 510 and the second cushion layer 520 may be greater than the thickness of the first adhesive layer 11. As will be described in detail later, since the thicknesses of the first cushion layer 510 and the second cushion layer 520 are greater than the thickness of the first adhesive layer 11, the first cushion layer 510 and the second cushion layer 520 may be compressed to support the display panel 200, when the set bracket is attached thereto during subsequent manufacturing process.

In this manner, the gap between the metal layer 400 and the passivation layer 300 may be filled, thereby preventing or at least suppressing generation of wrinkles in the folding portion A, which may be caused from repeated folding of the display device.

According to an exemplary embodiment, the thickness of the first adhesive layer 11 may be in a range of about 50 μm to about 85 μm, and the thickness of the cushion layer 500 may be in a range of 90 about μm to 150 about μm.

For example, the thickness of the cushion layer 500 may be about 10% to about 50% greater than the thickness of the first adhesive layer 11. When the difference of thickness between the cushion layer 500 and the first adhesive layer 11 is less than about 10%, the cushion layer 500 may not have sufficient supporting force, and when the thickness difference is greater than about 50%, a reactive force (or repulsive force) may be excessive so that the set bracket 700 may not be attached well to the display device.

Figure 3:
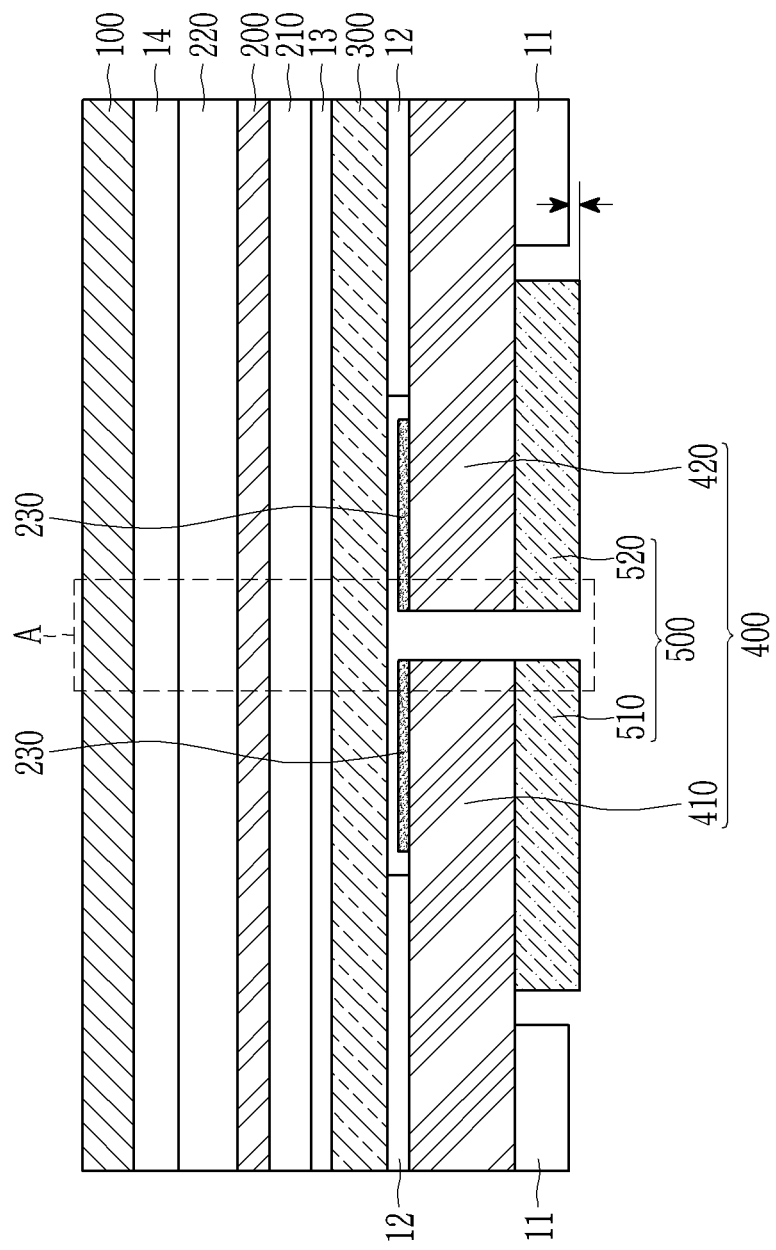
FIG. 3 is a cross-sectional view taken along line II-II' of FIG. 1 according to another exemplary embodiment.

FIG. 3 is a cross-sectional view taken along line II-II' according to another exemplary embodiment. The display device of FIG. 3 is substantially the same as that shown in FIG. 2, except for further including a third adhesive layer 13, a protective film layer 210, a polarizing layer 220, and a fourth adhesive layer 14. As such, repeated descriptions of the substantially the same elements described above will be omitted to avoid redundancy.

Referring to FIG. 3, the third adhesive layer 13 is disposed between the passivation layer 300 and the protective film layer 210 to attach the passivation layer 300 and the protective film layer 210 to each other.

The protective film layer 210 is disposed at a lower portion of the display panel 200. The protective film layer 210 may include a polyimide film, for example. The polarization layer 220 may be disposed at an upper portion of the display panel 200. The fourth adhesive layer 14 may be disposed between the polarization layer 220 and the window 100. However, the inventive concepts are not limited thereto, and in some exemplary embodiments, at least one or more layers described above may be omitted or at least one or more layers well known in the art may be added to the display device.

Figure 4:
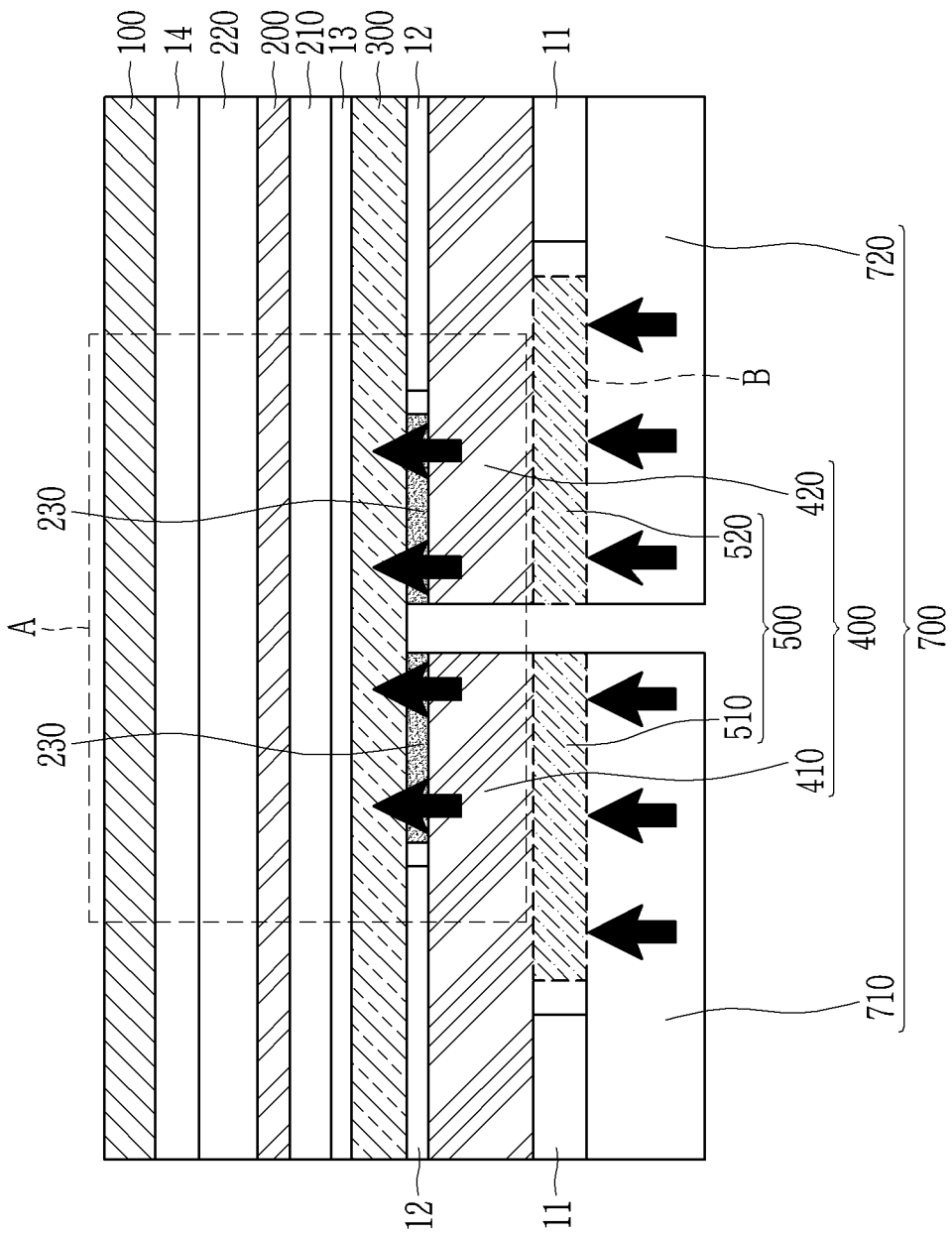
FIG. 4 is a schematic cross-sectional view illustrating a cushion layer supporting a display panel when a set bracket is applied to the display device of FIG. 1.

FIG. 4 is a schematic cross-sectional view illustrating the cushion layer 500 supporting the display panel 200 when the set bracket 700 is applied to the display device according to an exemplary embodiment.

Referring to FIG. 4, the set bracket 700 according to an exemplary embodiment may include a first portion 710 and a second portion 720 separated from each other. When the set bracket 700 is attached on to the first adhesive layer 11, the cushion layer 500 is compressed and has substantially the same thickness as the first adhesive layer 11, as indicated in area B of FIG. 4.

As the cushion layer 500 is compressed, the gap between the passivation layer 300 and the metal layer 400 is substantially removed by the reactive force. In addition, while the display panel 200 is supported by the compressive reactive force of the cushion layer 500, generation of wrinkles may be minimized or at least be suppressed in the folding portion A.

The reactive force supporting the display device is indicated by arrows in FIG. 4.

As illustrated in FIG. 4, when a rigid structure, such as the metal layer 400, is not disposed in the folding portion A of the display device, the rigid structure may not be sufficiently supported. In this case, wrinkles may be generated when folding and unfolding are repeated in the folding portion A.

In display devices constructed according to the principles and exemplary embodiments of the invention, a structure disposed in the folding portion A may be supported when the cushion layer 500 is compressed, thereby minimizing or at least suppressing generation of wrinkles in the folding portion A.

Figure 5:
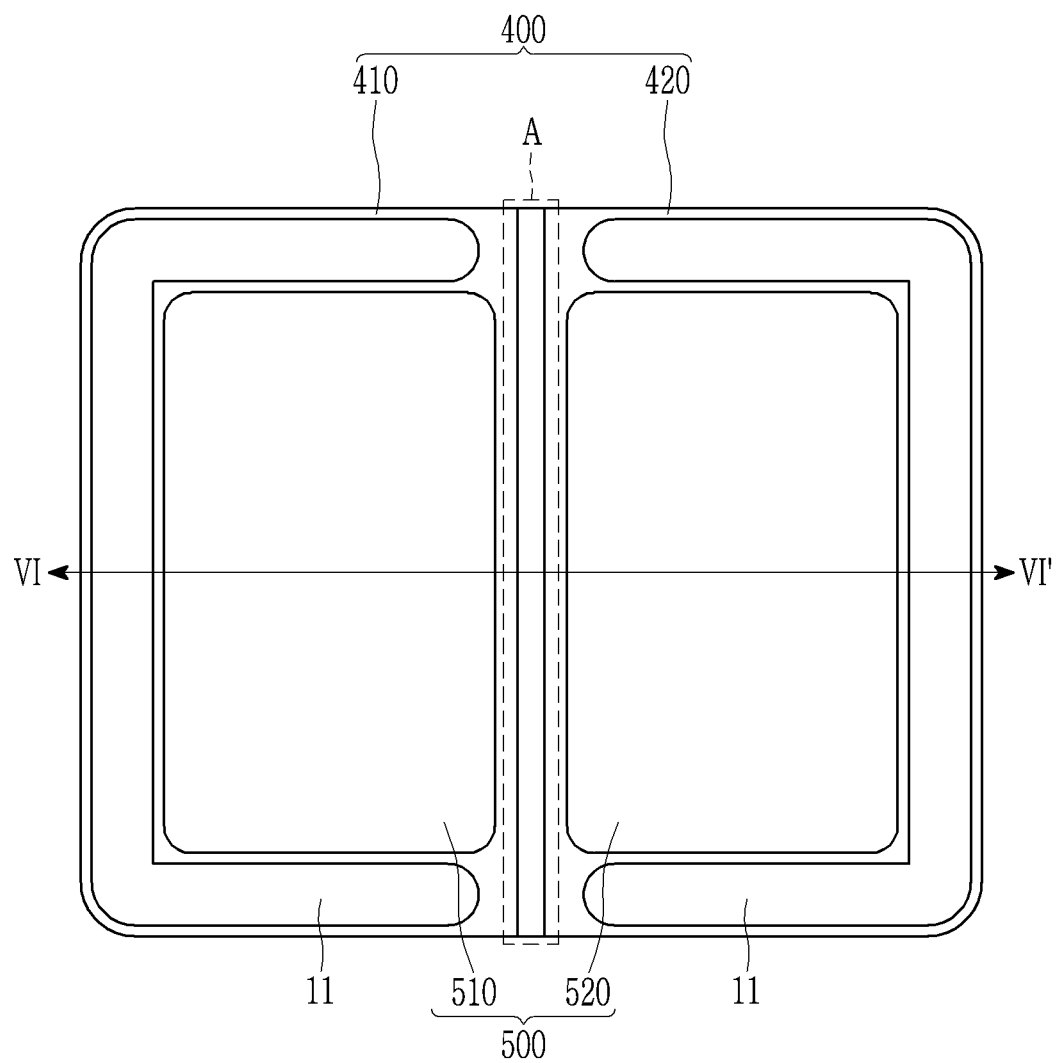
FIG. 5 is a schematic plan view of a display device according to a comparative embodiment.
Figure 6:
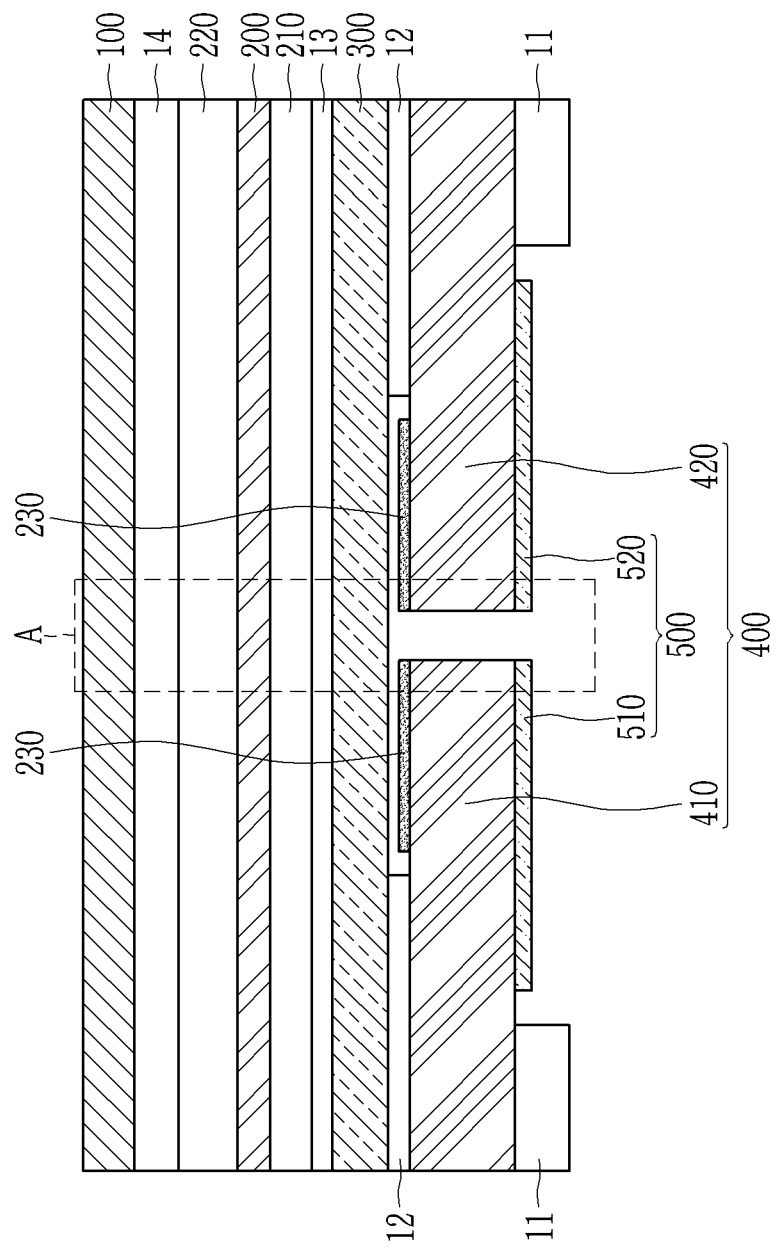
FIG. 6 is a cross-sectional view taken along line VI-VI' of FIG. 5.
Figure 7:
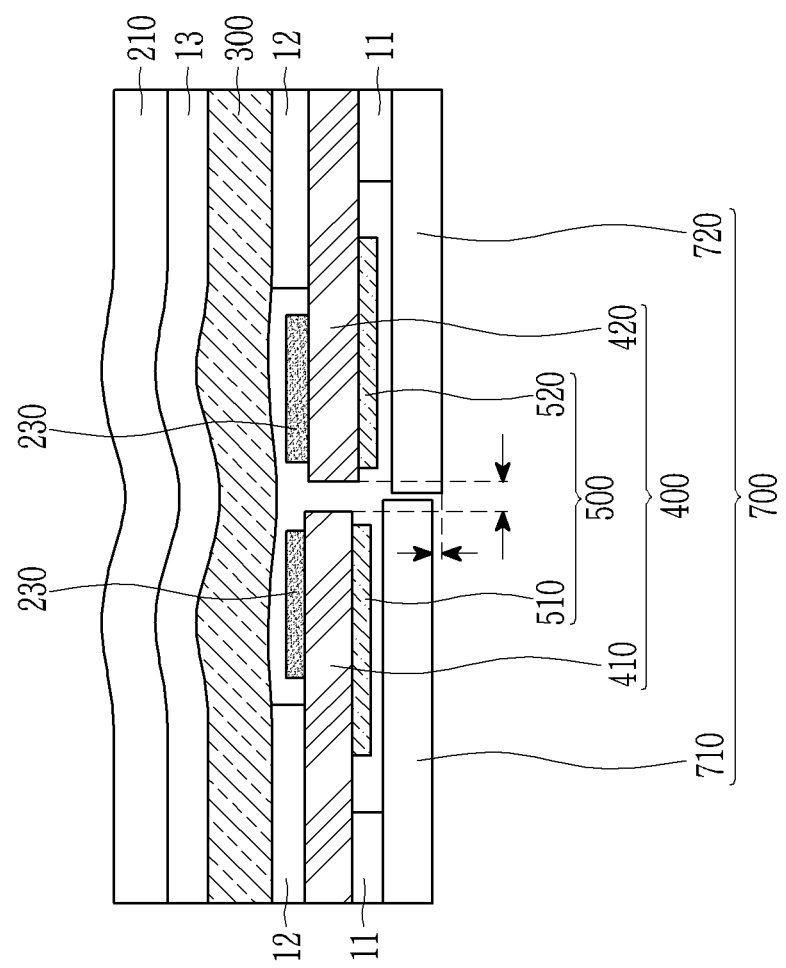
FIG. 7 is a cross-sectional view of a display device on which wrinkles are generated according to a comparative embodiment.

FIG. 5 to FIG. 7 illustrate a display device according to a comparative embodiment. FIG. 5 is a schematic plan view of a display device according to a comparative embodiment, and FIG. 6 is a cross-sectional view taken along line VI-VI' of FIG. 5.

Referring to FIG. 5 and FIG. 6, in the display device according to the comparative embodiment, the thickness of the cushion layer 500 is less than that of the first adhesive layer 11.

FIG. 7 is a cross-sectional view of a display device, on which wrinkles are generated, according to a comparative embodiment. FIG. 7 illustrates only a partial region of the display device.

Referring to FIG. 7, when the set bracket 700 is attached and used, the cushion layer 500 is not supported by the set bracket 700, and thus, wrinkles may be generated in the structure disposed in the bending area A. In addition, the display device may also be affected by a difference in thickness (step) formed between the first portion 710 and the second portion 720 of the set bracket 700, which may also cause wrinkles.

In display devices constructed according to the principles and exemplary embodiments of the invention, however, the cushion layer 500 has a thickness greater than that of the first adhesive layer 11. As such, when the set bracket 700 is attached, the cushion layer 500 is compressed to support the structure of the display device by the reactive force generated during the compression. Accordingly, generation of wrinkles in the folding portion A from repetitive folding and unfolding of the display device may be suppressed and/or minimized.

Hereinafter, an effect of the display device according to the exemplary embodiments will be described through experimental results. More particularly, various experiments were conducted on the display device of FIG. 2, whereby the first adhesive layer 11 was formed to have a thickness of 75 µm and the cushion layer 500 was formed to have a thickness of 100 µm, and the amount of deformation in various regions of the folding portion A of the display device was measured after repetitive folding and unfolding. In addition, as a comparative example, the amount of deformation in various areas of the folding portion A of a display device, which does not include a cushion layer, was measured after repetitive folding and unfolding.

Figure 8:
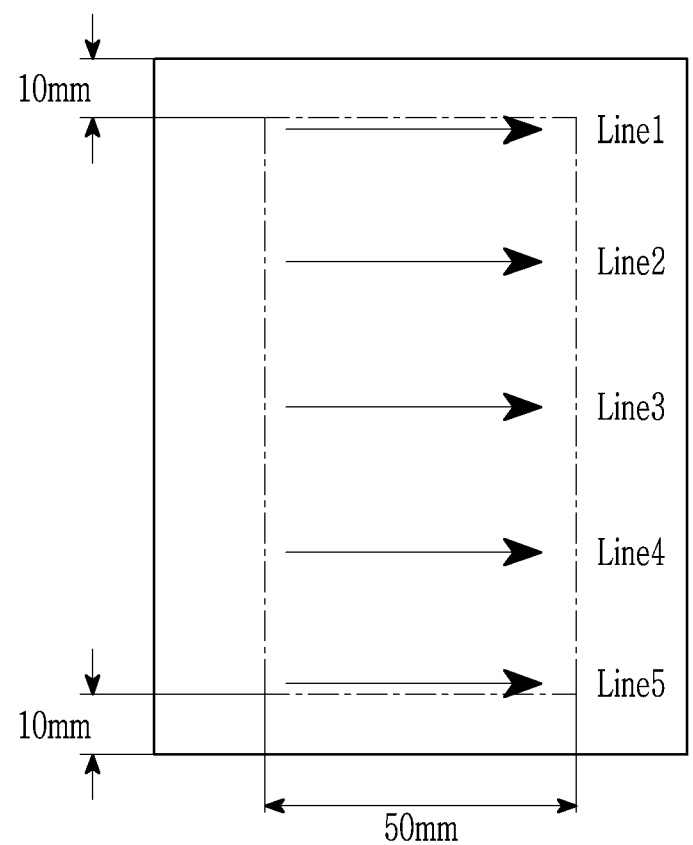
FIG. 8 is a diagram illustrating regions in which an amount of deformation of a folding portion is measured.
Figure 9:
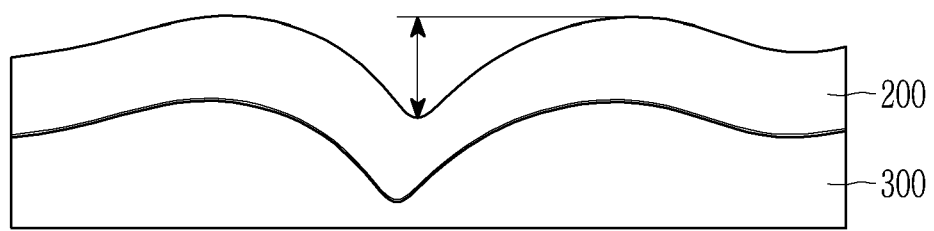
FIG. 9 is a side elevation view of a foldable display device schematically illustrating a method of measuring an amount of deformation of the folding portion.

FIG. 8 illustrates regions Line 1, Line 2 . . . Line 5 of the folding portion A, at which the amount of deformation is measured. FIG. 9 illustrates a method of measuring the amount of deformation in the folding portion A. More particularly, the depth of the wrinkles formed in the display panel 200 (as indicated by arrows of FIG. 9) was measured.

Table 1 below shows the amount of deformation in each line of the folded portion A, when the display device includes the first adhesive layer having a thickness of 75 µm and the cushion layer having a thickness of 100 µm according to an exemplary embodiment. The experiment was repeated three times.

TABLE 1

| Exemplary Embodiment | | | | | | |
| --- | --- | --- | --- | --- | --- | --- |
| SAMPLE | Line 1 | Line 2 | Line 3 | Line 4 | Line 5 | Average (mm) |
| 1 | 0.0420 | 0.0350 | 0.0370 | 0.0370 | 0.0410 | 0.0384 |
| 2 | 0.0480 | 0.0432 | 0.0450 | 0.0420 | 0.0490 | 0.0454 |
| 3 | 0.0510 | 0.0390 | 0.0540 | 0.0480 | 0.0450 | 0.0474 |

In addition, Table 2 below shows the amount of deformation in each line of the folded portion A, when the display device does not include a cushion layer according to a comparative embodiment. The experiment was repeated three times.

TABLE 2

| Comparative Embodiment | | | | | | |
| --- | --- | --- | --- | --- | --- | --- |
| SAMPLE | Line 1 | Line 2 | Line 3 | Line 4 | Line 5 | Average (mm) |
| 1 | 0.0580 | 0.0670 | 0.0680 | 0.0550 | 0.0490 | 0.0594 |
| 2 | 0.0602 | 0.0710 | 0.0660 | 0.0610 | 0.0520 | 0.0620 |
| 3 | 0.0590 | 0.0690 | 0.0690 | 0.0710 | 0.0740 | 0.0684 |

Referring to Table 1 and Table 2, it can be seen that the average amount of deformation in the folding portion A is about 0.06 mm in the comparative embodiment, while the average amount of deformation in the folding portion A is about 0.04 mm in the display device according to an exemplary embodiment.

These results confirm that the display device according to an exemplary embodiment significantly reduces the amount of deformation in the folding portion A.

Hereinafter, a display device according to another exemplary embodiment will be described with reference to the drawings.

Figure 10:
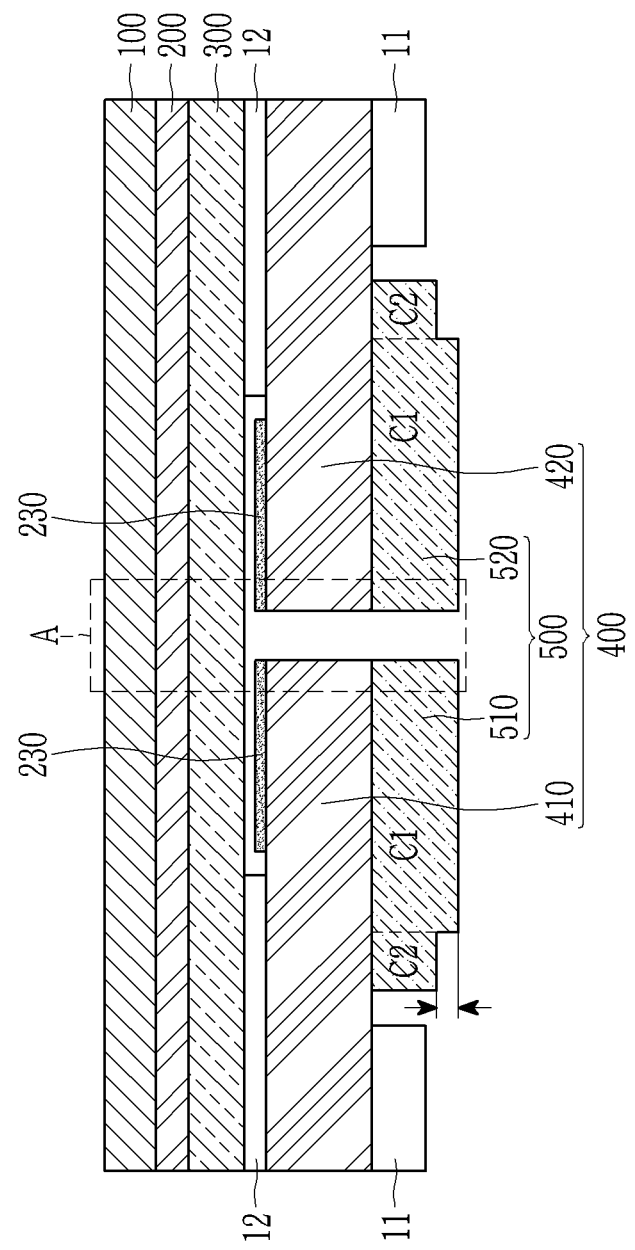
FIG. 10 is a cross-sectional view taken along line II-II' of FIG. 1 according to another exemplary embodiment.

FIG. 10 is a cross-sectional view taken line II-II' of FIG. 1 according to another exemplary embodiment.

Referring to FIG. 10, the display device according to the illustrated exemplary embodiment is substantially the same as the display device of FIG. 2, except for the shape of the cushion layer 500. As such, repeated descriptions of substantially the same elements described above will be omitted to avoid redundancy.

Referring to FIG. 10, the first cushion layer 510 and the second cushion layer 520 include a first region C1 and a second region C2 having different thicknesses. The first region C1 has a thickness greater than that of the second region C2, such that a step is formed therebetween. The first region C1 is disposed closer to the folding portion A than the second region C2.

When the cushion layer 500 is formed with the step as described above, the folding portion A of the display device can be more stably supported when the set bracket 700 is attached. More particularly, the display device according to the illustrated exemplary embodiment has a thicker cushion layer 500 adjacent to the folding portion A, such that the supporting effect by the cushion layer 500 from the compressive/reactive force may be improved in the folding portion A. Since the compressive/reactive force of the cushion layer 500 is higher in regions adjacent to the folding portion A, the generation of wrinkles in the folding portion A may be further suppressed.

Figure 11:
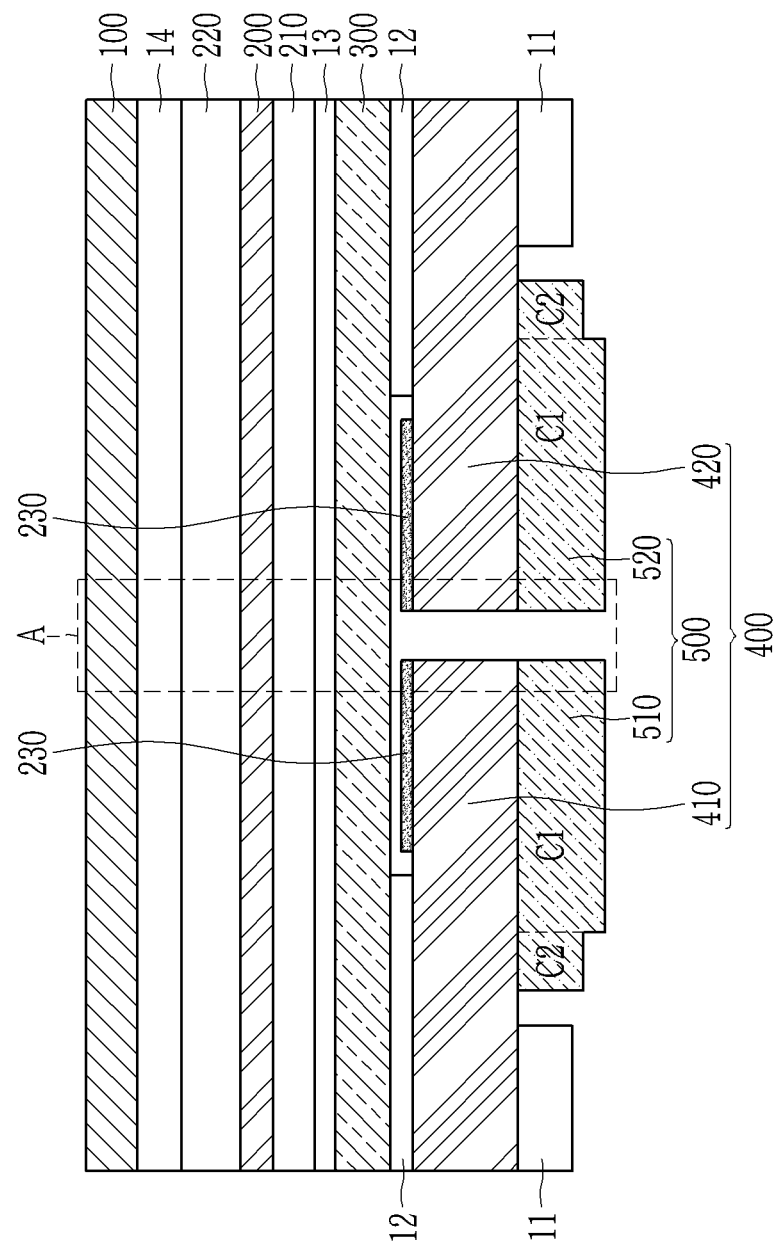
FIG. 11 is a cross-sectional view taken along line II-II' of FIG. 1 according to still another exemplary embodiment.

FIG. 11 is a cross-sectional view taken along line II-II' of FIG. 1 according to another exemplary embodiment. The display device of FIG. 11 is substantially the same as that of FIG. 10, except for further including a third adhesive layer 13, a protective film layer 210, a polarizing layer 220, and a fourth adhesive layer 14, which may be substantially the same as those illustrated above with reference to FIG. 3. As such, repeated descriptions of the substantially same elements will be omitted to avoid redundancy.

Figure 12:
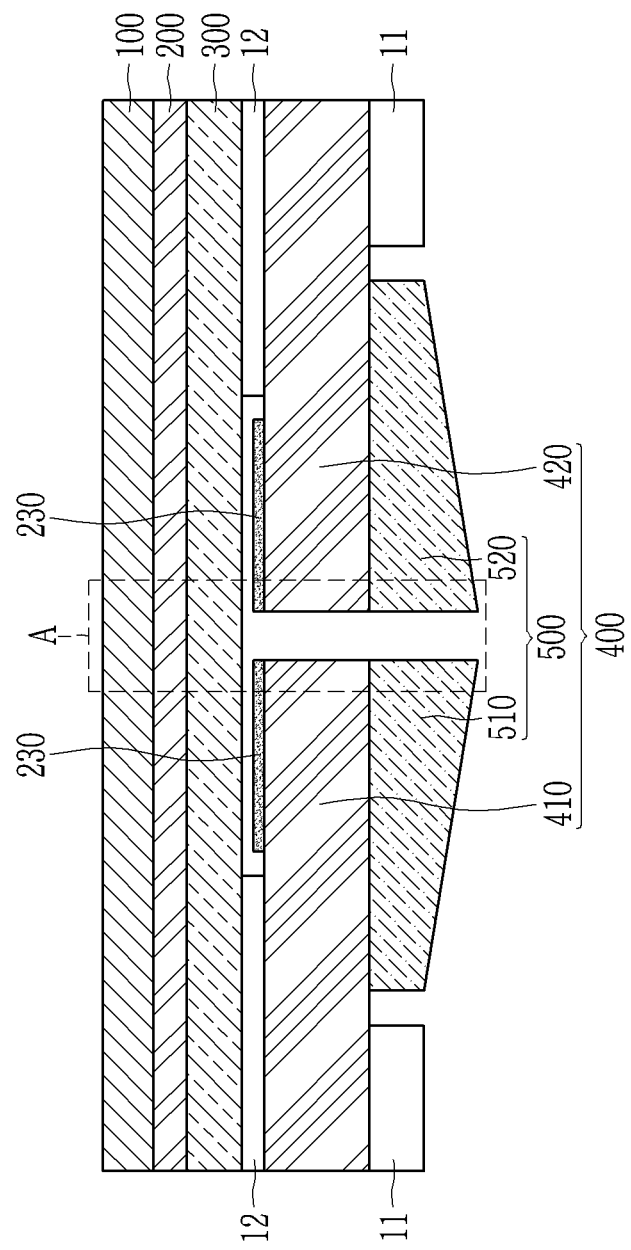
FIG. 12 is a cross-sectional view taken along line II-II' of FIG. 1 according to yet another exemplary embodiment.

FIG. 12 is a cross-sectional view taken along line II-II' of FIG. 1 according to yet another exemplary embodiment. The display device according to the illustrated exemplary embodiment is substantially the same as the display device of FIG. 2, except for the shape of the cushion layer 500. As such, repeated descriptions of substantially the same elements will be omitted.

Referring to FIG. 12, the cushion layer 500 according to the illustrated exemplary embodiment has a shape, in which the thickness thereof gradually increases from one end to another end adjacent to the folding portion A. More particularly, the first cushion layer 510 may become thicker in a direction from the first adhesive layer 11 to the folding portion A. Similarly, the second cushion layer 520 may become thicker in a direction from the first adhesive layer 11 to the folding portion A.

In this case, as the cushion layer 500 is compressed when the set bracket 700 is attached thereto in the folding portion A, the reactive force caused by the compression and the supporting force for the display device may be improved, which may effectively prevent or at least suppress the generation of wrinkles. In particular, the cushion layer 500 is formed to be thicker in a region where the bending is likely to occur, thereby effectively supporting the display device.

Figure 13:
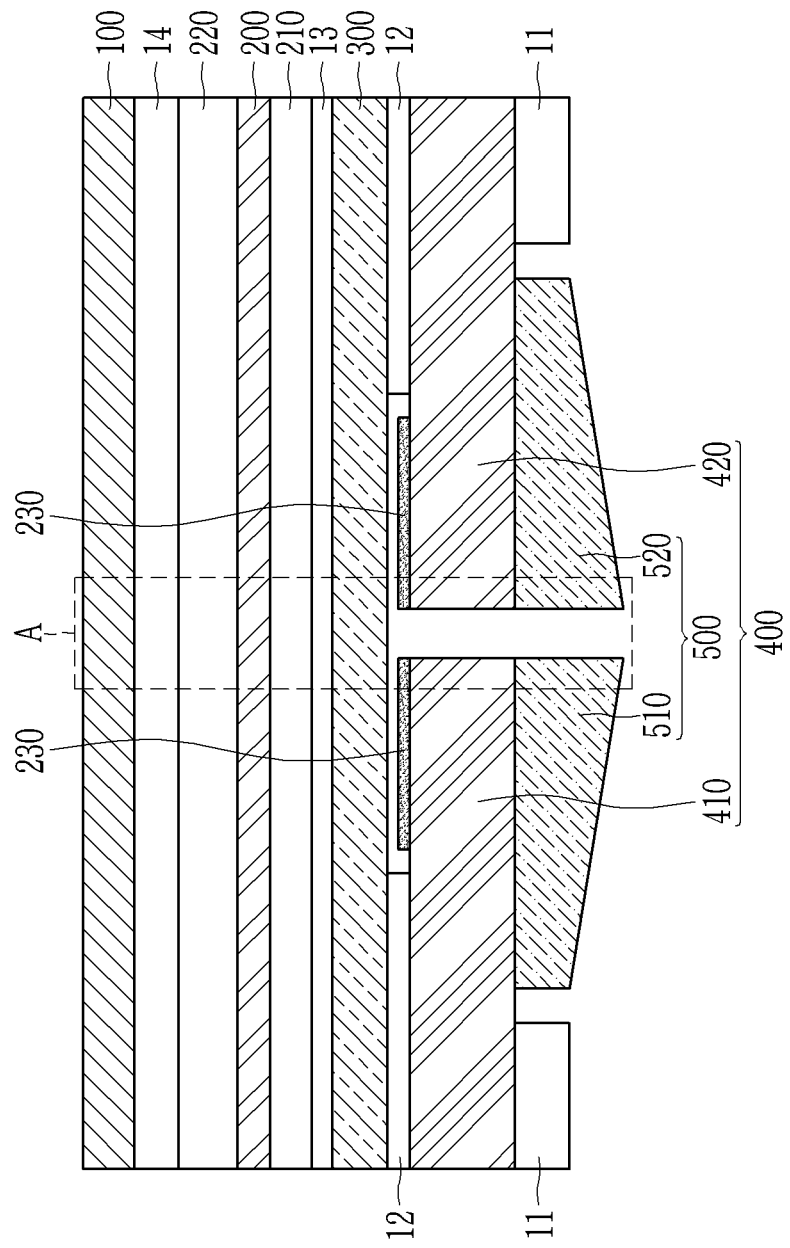
FIG. 13 is a cross-sectional view taken along line II-II' of FIG. 1 according to yet still another exemplary embodiment.

FIG. 13 is a cross-sectional view taken along line II-II' of FIG. 1 according to another exemplary embodiment. The display device of FIG. 13 is substantially the same as that of FIG. 12, except for further including a third adhesive layer 13, a protective film layer 210, a polarizing layer 220, and a fourth adhesive layer 14, which are substantially the same as those described above with reference to FIG. 3. As such, repeated descriptions of the substantially the same elements will be omitted.

Figure 14:
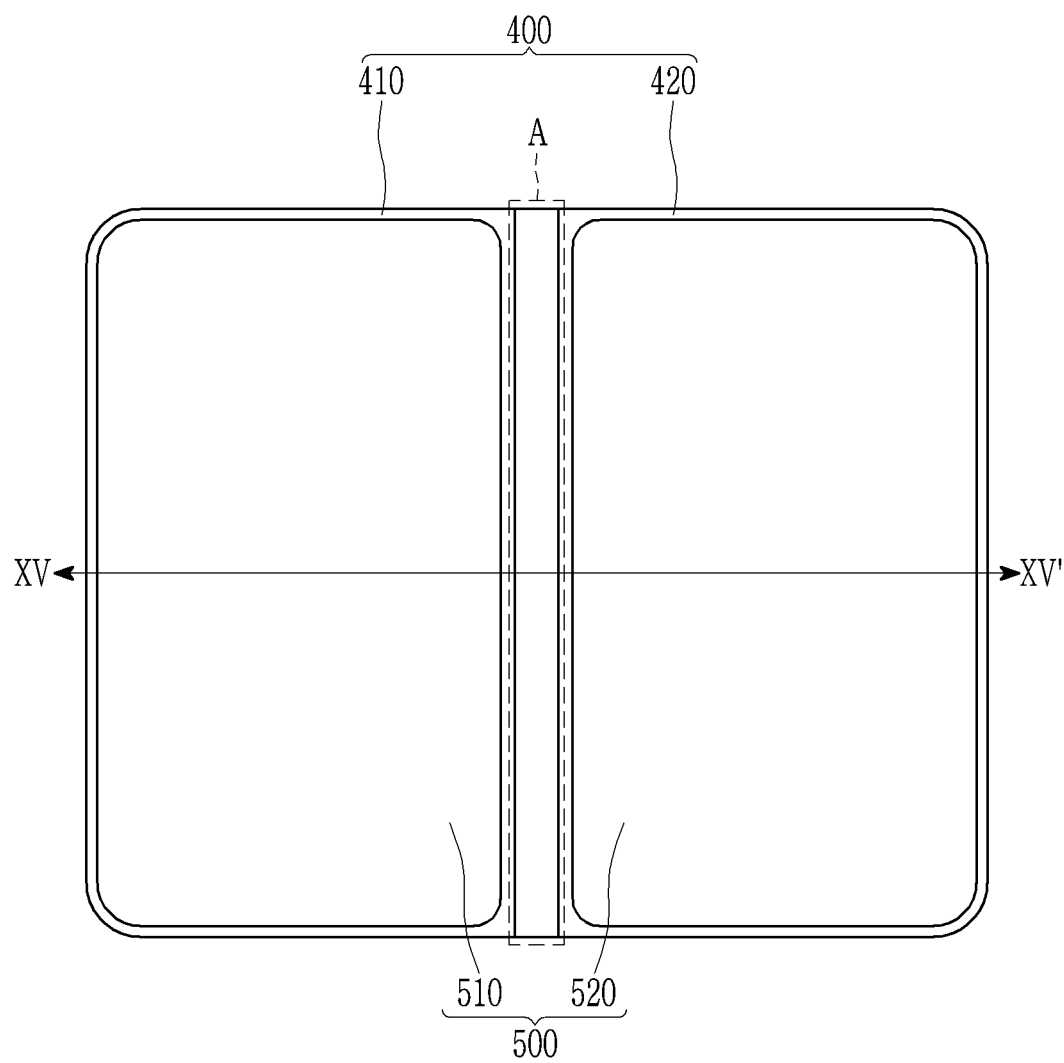
FIG. 14 is a schematic plan view of another exemplary embodiment of a display device constructed according to the principles of the invention.
Figure 15:
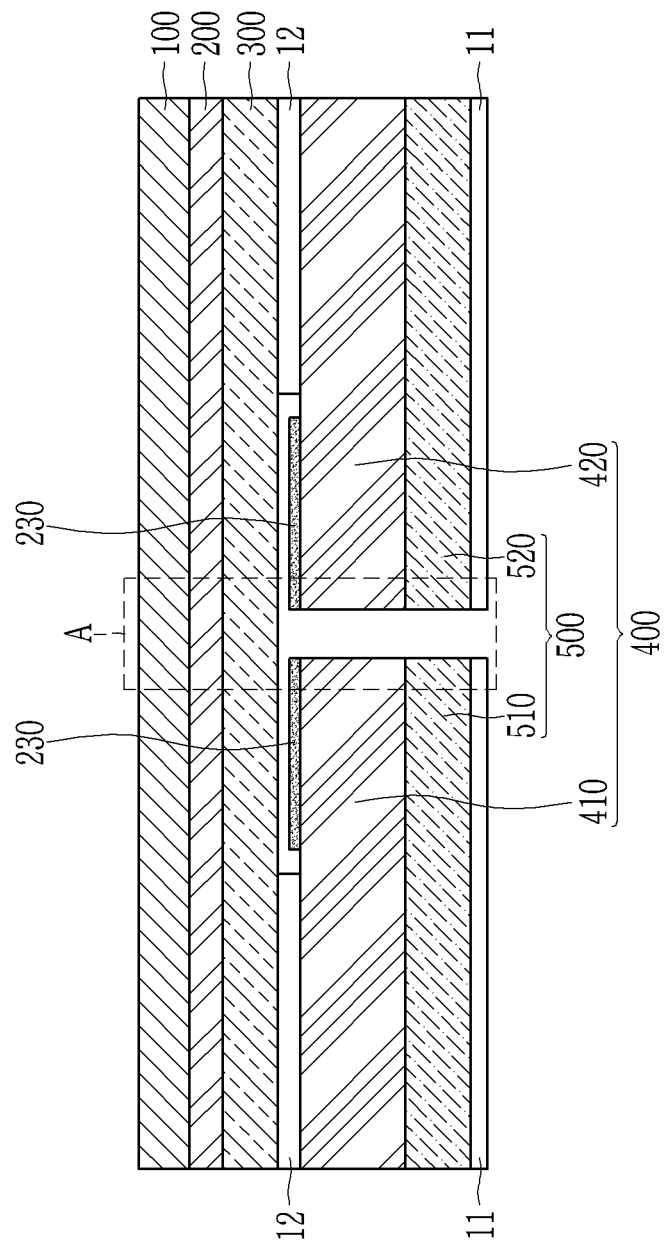
FIG. 15 is a cross-sectional view taken along line XV-XV' of FIG. 14 according to an exemplary embodiment.

FIG. 14 is schematic plan view of another exemplary embodiment of a display device constructed according to the principles of the invention. FIG. 15 is a cross-sectional view taken along line XV-XV' of FIG. 14.

Referring to FIG. 14 and FIG. 15, the display device according to the illustrated exemplary embodiment is substantially the same as the display device FIG. 1 and FIG. 2, except for shapes of the first adhesive layer 11 and the cushion layer 500.

Referring to 14 and 15, in the display device according to the illustrated exemplary embodiment, the cushion layer 500 is disposed on a front surface of the metal layer 400 that faces away the display panel 200. The first adhesive layer 11 may not be disposed on the metal layer 400, but may be disposed on the front surface of the cushion layer 500 that faces away the display panel 200. As such, when the set bracket 700 is attached thereto in subsequent process, the display device is attached to the set bracket 700 through the first adhesive layer 11 disposed on the front surface of the cushion layer 500. When the cushion layer 500 is disposed on the front surface of the display device, generation of wrinkles may be effectively prevented or at least suppressed on substantially the entire area of the display device. In addition, it is possible to prevent the occurrence of wrinkles caused by a step difference between the first adhesive layer 11 and the cushion layer 500.

Figure 16:
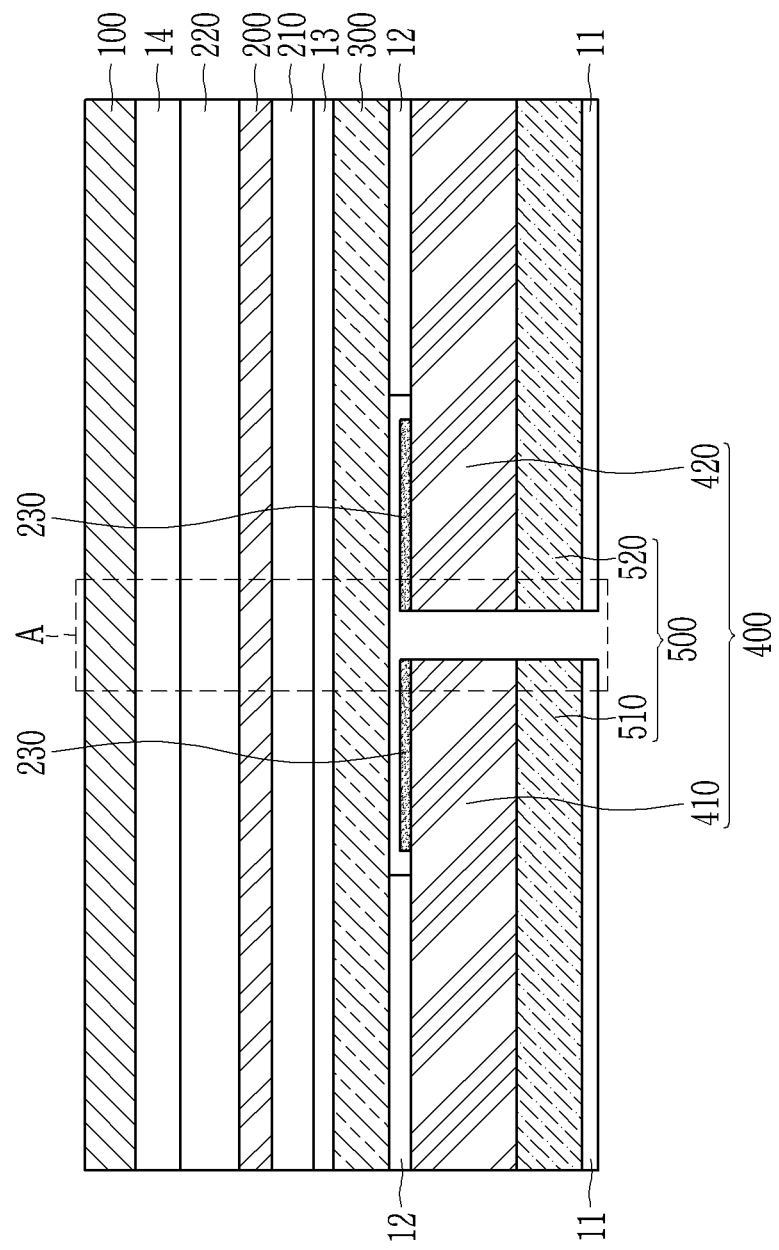
FIG. 16 is a cross-sectional view taken along line XV-XV' of FIG. 14 according to another exemplary embodiment.

FIG. 16 is a cross-sectional view taken along line XV-XV' of FIG. 14 according to another exemplary embodiment. The display device of FIG. 16 is substantially the same as that of FIG. 15, except for further including a third adhesive layer 13, a protective film layer 210, a polarizing layer 220, and a fourth adhesive layer 14, which are substantially the same as those of FIG. 3. As such, repeated descriptions of substantially the same elements will be omitted.

Figure 17:
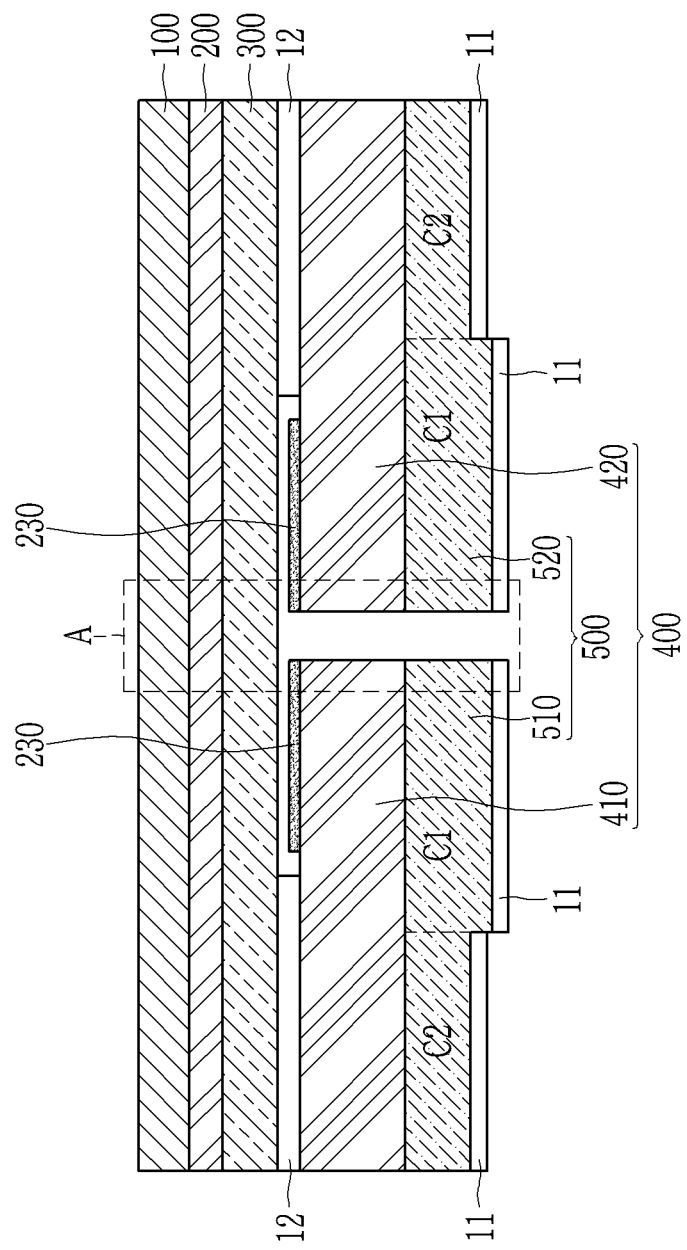
FIG. 17 is a cross-sectional view taken along line XV-XV' of FIG. 14 according to another exemplary embodiment.

FIG. 17 is a cross-sectional view taken along line XV-XV' of FIG. 14 according to still another exemplary embodiment. Referring to FIG. 17, the display device according to the illustrated exemplary embodiment is substantially the same as the display device of FIG. 15, except for the shape of the cushion layer 500. As such, repeated descriptions of substantially the same elements will be omitted.

Referring to FIG. 17, each of the first cushion layer 510 and the second cushion layer 520 according to the illustrated exemplary embodiment includes a first region C1 and a second region C2 having different thicknesses. The first region C1 has a thickness greater than that of the second region C2. The first region C1 is disposed closer to the folding portion A than the second region C2.

The first adhesive layer 11 is disposed on the cushion layer 500. As such, when the set bracket 700 is attached thereto later during subsequent process, the display device is attached to the set bracket 700 through the first adhesive layer 11 disposed on the front surface of the cushion layer 500. When the cushion layer 500 is formed with a step as described above, the folding portion A of the display device can be more stably supported when the set bracket is attached.

Figure 18:
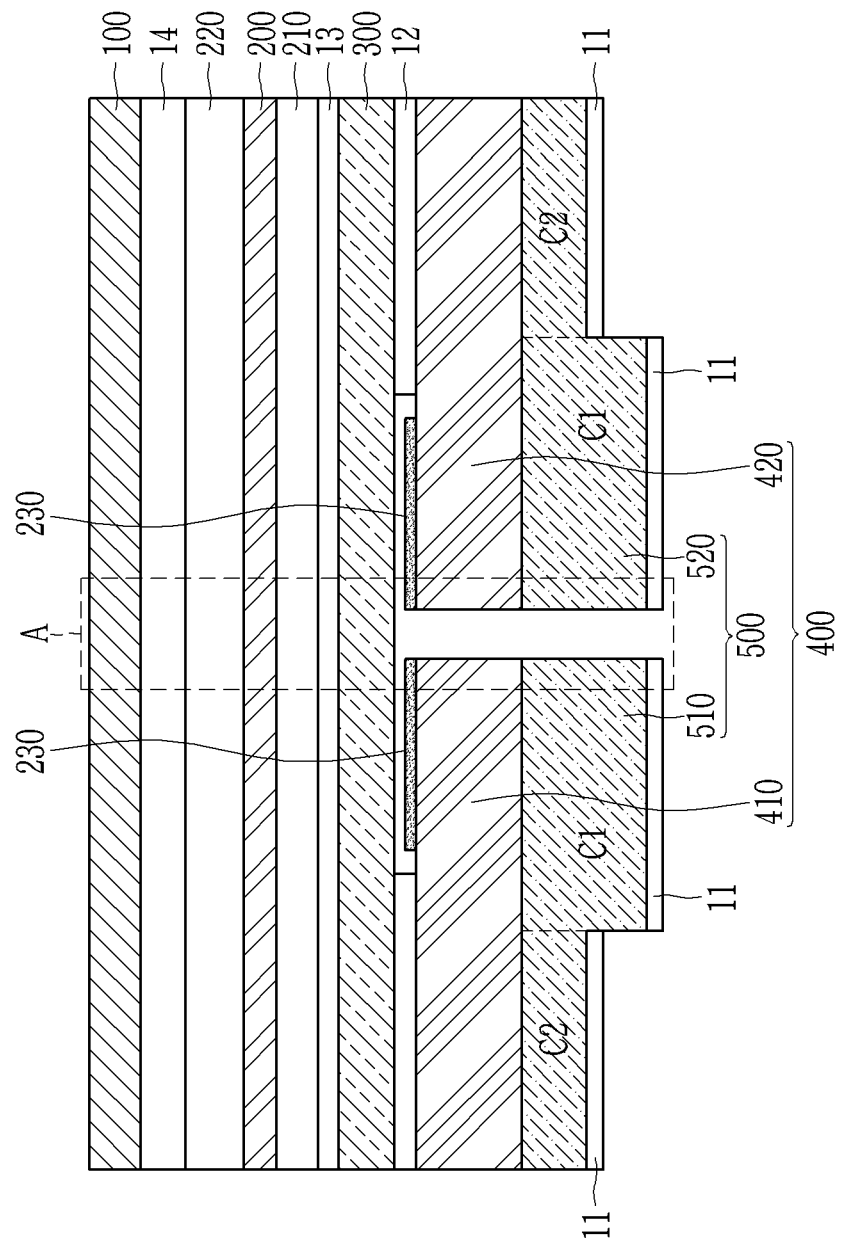
FIG. 18 is a cross-sectional view taken along line XV-XV' of FIG. 14 according to still another exemplary embodiment.

FIG. 18 is a cross-sectional view taken along line XV-XV' of FIG. 14 according to yet another exemplary embodiment. The display device of FIG. 18 is substantially the same as that of FIG. 17, except for further including a third adhesive layer 13, a protective film layer 210, a polarizing layer 220, and a fourth adhesive layer 14, which are substantially the same as those of FIG. 3. As such, repeated descriptions of substantially the same elements will be omitted.

Figure 19:
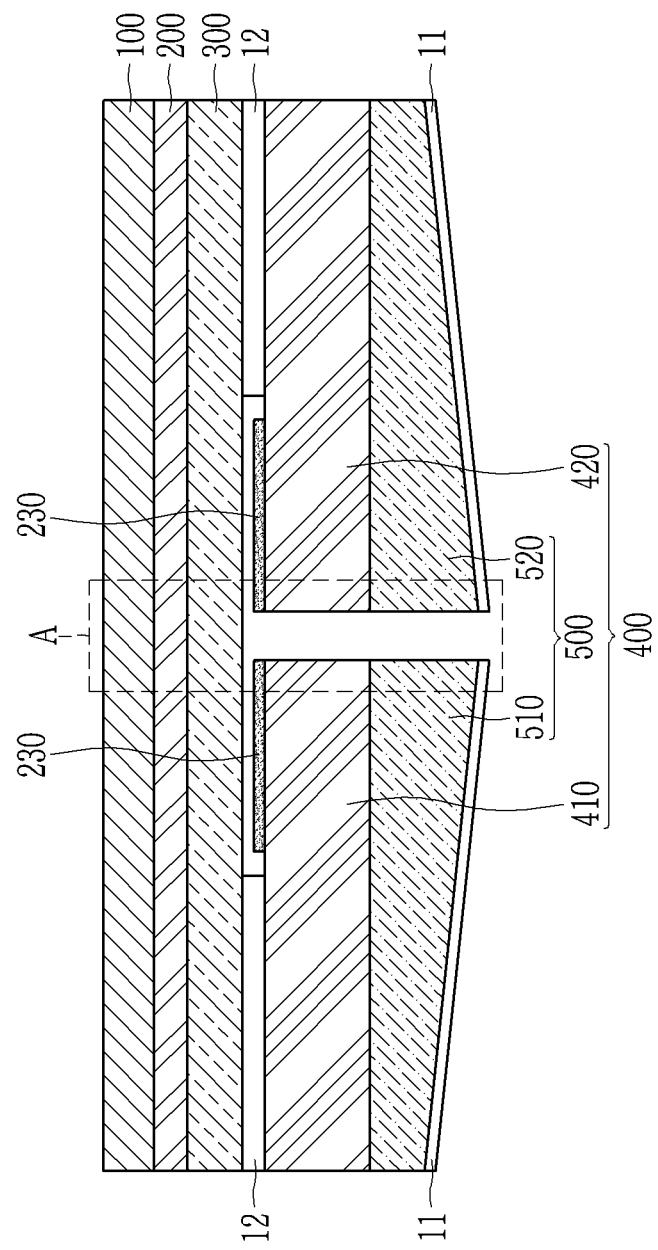
FIG. 19 is a cross-sectional view taken along line XV-XV' of FIG. 14 according to yet another exemplary embodiment.

FIG. 19 is a cross-sectional view taken along line XV-XV' of FIG. 14 according to yet still another exemplary embodiment. Referring to FIG. 19, the display device according to the illustrated exemplary embodiment is substantially the same as the display device of FIG. 15, except for the shape of the cushion layer 500. As such, repeated descriptions of substantially the same elements will be omitted.

The cushion layer 500 according to the illustrated exemplary embodiment has a shape, in which the thickness thereof gradually increases along a direction towards the folding portion A. More particularly, as illustrated in FIG. 19, the first cushion layer 510 may become thicker in a direction from one end thereof towards the folding portion A. Similarly, the second cushion layer 520 may become thicker in a direction from one end thereof towards the folding portion A.

The first adhesive layer 11 is disposed on the cushion layer 500. As such, when the set bracket 700 is attached thereto later during subsequent process, the display device is attached to the set bracket 700 through the first adhesive layer 11 disposed on the front surface of the cushion layer 500.

In addition, when the thickness of the cushion layer 500 gradually increases, as the cushion layer 500 is compressed in the folding portion A, the reactive forces from the compression are increased and the supporting force for the display device may be improved, which may effectively prevents or at least suppresses the generation of wrinkles.

Figure 20:
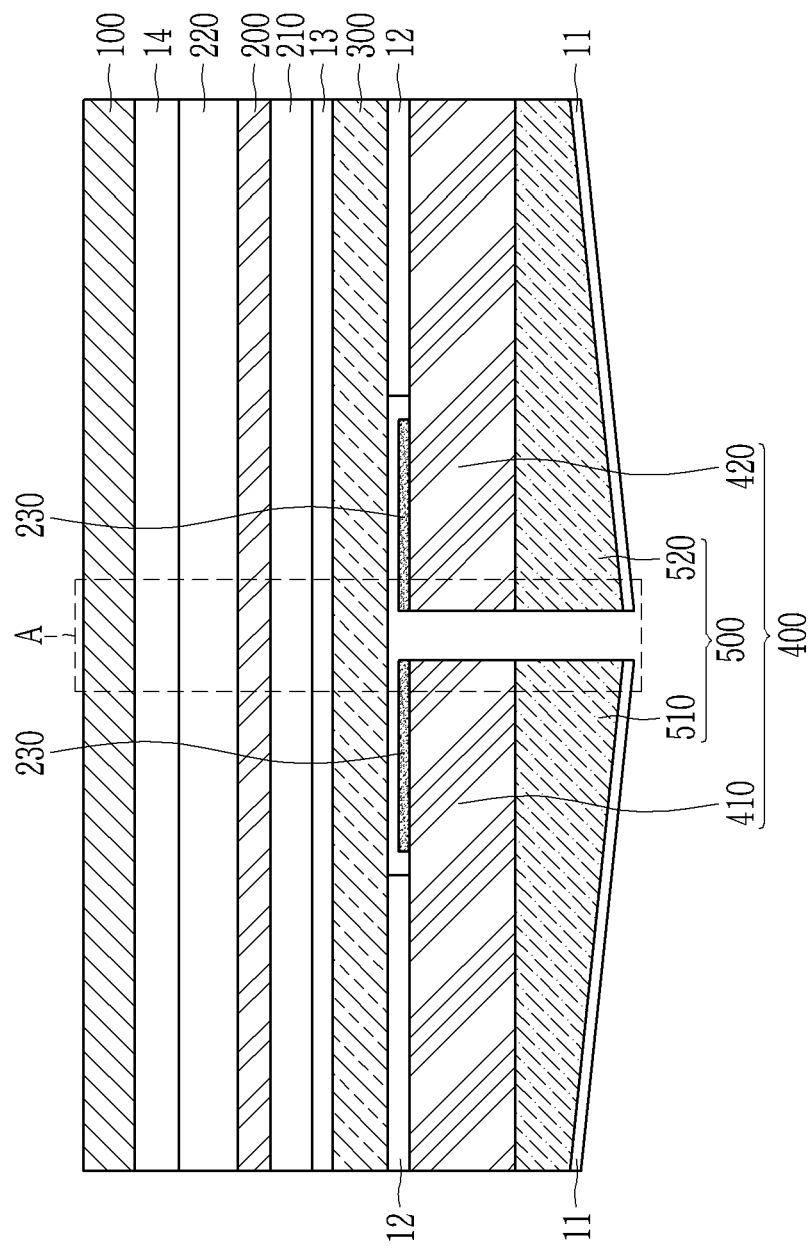
FIG. 20 is a cross-sectional view taken along line XV-XV' of FIG. 14 according to still yet another exemplary embodiment.

FIG. 20 is a cross-sectional view taken along line XV-XV' of FIG. 14 according to still yet another exemplary embodiment. The display device of FIG. 20 is substantially the same that of FIG. 19, except for further including a third adhesive layer 13, a protective film layer 210, a polarizing layer 220, and a fourth adhesive layer 14, which are substantially the same as those of FIG. 3. As such, repeated descriptions of substantially the same elements will be omitted.

According to the principles and exemplary embodiments of the invention, it is possible to provide a display device that reduces or at least suppresses generation of wrinkles in a folding portion.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device comprising:
a display panel longitudinally extending along a first direction and including a folding portion;
a metal layer disposed on one surface of the display panel, and including a first metal layer and a second metal layer spaced apart from each other in the folding portion;
a first adhesive layer disposed at edges of the first metal layer and the second metal layer; and
a first compressible member disposed on the first metal layer and a second compressible member disposed on the second metal layer, the first and second compressible members being spaced apart to face each other in the first direction and disposed closer to the folding portion than the first adhesive layer;
wherein the first and second compressible members each have a thickness greater than a thickness of the first adhesive layer,
wherein the first and second compressible members include a polymer,
wherein the first compressible member and the second compressible member do not overlap in a direction perpendicular to the surface of the display panel, and
wherein the first adhesive layer and the first compressible member are disposed on the same surface of the first metal layer.

2. The display device of claim 1, wherein the first and second compressible members comprise first and second cushion layers, respectively, in which the thicknesses of the first cushion layer and the second cushion layer are about 10% to about 50% thicker than the thickness of the first adhesive layer.

3. The display device of claim 1, wherein the thickness of the first adhesive layer is in a range of about 50 μm to about 85 μm.

4. The display device of claim 1, wherein the first and second compressible members comprise first and second cushion layers, respectively, in which the thicknesses of the first cushion layer and the second cushion layer are in a range of about 90 μm to about 150 μm.

5. The display device of claim 1, wherein the first adhesive layer is spaced apart from at least one of the first and second compressible members.

6. The display device of claim 1, further comprising a set bracket including a first portion and a second portion spaced apart from each other,
wherein:
the first portion of the set bracket is attached to the first metal layer through the first adhesive layer; and
the second portion of the set bracket is attached to the second metal layer through the first adhesive layer.

7. The display device of claim 6, wherein the first and second compressible members is compressed by the set bracket.

8. The display device of claim 7, wherein the first and second compressible members compressed by the set bracket have a same thickness with the thickness of the first adhesive layer, and
the first and second compressible member support the display panel.

9. A display device comprising:
a display panel longitudinally extending along a first direction and including a folding portion;
a metal layer disposed on one surface of the display panel, the metal layer including a first metal layer and a second metal layer spaced apart from each other in the folding portion;
a first adhesive layer disposed at edges of the first metal layer and the second metal layer; and
a first compressible member disposed on the first metal layer and a second compressible member disposed on the second metal layer, the first compressible member and the second compressible member being spaced apart to face each other in the first direction, and each of the first and second compressible members including a first portion and a second portion,
wherein:
the first portion has a thickness greater than that of the second portion;
the first portion is disposed closer to the folding portion than the second portion;
the first and second compressible members include a polymer;
the first compressible member and the second compressible member do not overlap in a direction perpendicular to the surface of the display panel; and the first adhesive layer and the first compressible member are disposed on the same surface of the first metal layer.

10. The display device of claim 9, wherein the thickness of the first portion of each of the first and second compressible members is greater than that of the first adhesive layer.

11. A display device comprising:
a display panel longitudinally extending along a first direction and including a folding portion;
a metal layer disposed on one surface of the display panel, and including a first metal layer and a second metal layer spaced apart from each other in the folding portion;
a first adhesive layer disposed at edges of the first metal layer and the second metal layer; and
a first compressible member disposed on the first metal layer and a second compressible member disposed on the second metal layer, the first compressible member and the second compressible member being spaced apart to face each other in the first direction,
wherein at least one of the first and second compressible members has a thickness that increases towards the folding portion,
wherein the first and second compressible members include a polymer,
wherein the first compressible member and the second compressible member do not overlap in a direction perpendicular to the surface of the display panel, and
wherein the first adhesive layer and the first compressible member are disposed on the same surface of the first metal layer.

12. The display device of claim 11, wherein the first and the second compressible members comprise a first cushion layer and a second cushion layer, respectively, each of which is spaced apart from the first adhesive layer, and disposed closer to the folding portion than the first adhesive layer.

13. A display device comprising:
a display panel longitudinally extending along a first direction and including a folding portion;
a metal layer disposed on one surface of the display panel, and including a first metal layer and a second metal layer spaced apart from each other in the folding portion;
a first adhesive layer disposed at edges of the first metal layer and the second metal layer; and
a first compressible member disposed on the first metal layer and a second compressible member disposed on the second metal layer, the first and second compressible members being spaced apart to face each other in the first direction and disposed closer to the folding portion than the first adhesive layer;
a set bracket including a first portion and a second portion spaced apart from each other,
wherein:
the first portion of the set bracket is attached to the first metal layer through the first adhesive layer; and the second portion of the set bracket is attached to the second metal layer through the first adhesive layer;
the first and second compressible members is compressed by the set bracket; and
the first and second compressible members have a same thickness with the thickness of the first adhesive layer, and the first and second compressible member support the display panel;
the first and second compressible members include a polymer;
the first compressible member and the second compressible member do not overlap in a direction perpendicular to the surface of the display panel; and
the first adhesive layer and the first compressible member are disposed on the same surface of the first metal layer.

* * * * *